(12) United States Patent
Uda (10) Patent No.: US 11,929,432 B2
(45) Date of Patent: Mar. 12, 2024

(54) SEMICONDUCTOR DEVICE (71) Applicant: LAPIS SEMICONDUCTOR CO., LTD., Kanagawa (JP)

(72) Inventor: Kazuya Uda, Miyagi (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 17/097,115

(22) Filed: Nov. 13, 2020

(65) Prior Publication Data

US 2021/0066496 A1 Mar. 4, 2021

Related U.S. Application Data

(62) Division of application No. 16/355,620, filed on Mar. 15, 2019, now abandoned.

(30) Foreign Application Priority Data

Mar. 29, 2018 (JP) .................................. 2018-64309

(51) Int. Cl.
*H01L 29/78* (2006.01)
*H01L 29/06* (2006.01)
(Continued)

(52) U.S. Cl.
CPC ...... *H01L 29/7825* (2013.01); *H01L 29/0607* (2013.01); *H01L 29/0865* (2013.01);
(Continued)

(58) Field of Classification Search
CPC ............. H01L 29/7825; H01L 29/0865; H01L 29/0607; H01L 29/4236; H01L 29/0882;
(Continued)

(56) References Cited

U.S. PATENT DOCUMENTS 9,306,034 B2 4/2016 Tu et al.
9,825,147 B2 11/2017 Hsu
(Continued)

FOREIGN PATENT DOCUMENTS

JP 2008-182106 A 8/2008
JP 2011-187853 A 9/2011
(Continued)

OTHER PUBLICATIONS

Japanese Office Action dated Mar. 14, 2023 in Japanese Patent Application No. 2022-036355 with English translation, 6 pgs.

*Primary Examiner* — Andres Munoz
(74) *Attorney, Agent, or Firm* — Volentine, Whitt & Francos, PLLC (57) ABSTRACT

A semiconductor device including a source region formed at one main face of a semiconductor substrate; a drain region formed at the one main face and connected to the source region through a channel region; a gate electrode formed above the channel region; a drift layer formed at the one main face at a position between a lower portion of the gate electrode and the drain region; a trench including an opening in which one end is at the lower portion of the gate electrode and another end is at a position adjacent to the drain region, the trench being formed in the semiconductor substrate at a predetermined depth from the one main face to cut vertically across the drift layer; and an electrical field weakening portion, provided at vicinity of the one end, that weaken an electrical field generated between the source region and the drain region.

9 Claims, 9 Drawing Sheets

(51) Int. Cl.
  *H01L 29/08* (2006.01)
  *H01L 29/423* (2006.01)
(52) U.S. Cl.
  CPC ...... *H01L 29/0882* (2013.01); *H01L 29/4236* (2013.01); *H01L 29/7835* (2013.01)
(58) Field of Classification Search
  CPC ........... H01L 29/0847; H01L 29/42376; H01L 29/42368; H01L 29/407; H01L 29/0653; H01L 29/7835; H01L 29/7816; H01L 29/0638; H01L 27/0266
  See application file for complete search history.

(56) References Cited

U.S. PATENT DOCUMENTS

| | | | |
|---|---|---|---|
| 10,505,038 | B2 | 12/2019 | Lee et al. |
| 2003/0001202 | A1 | 1/2003 | Kitamura |
| 2004/0173859 | A1* | 9/2004 | Hao ................ H01L 29/7835 |
| | | | 257/E29.268 |
| 2007/0235779 | A1 | 10/2007 | Dietz et al. |
| 2008/0067615 | A1* | 3/2008 | Kim ................ H01L 29/0653 |
| | | | 257/E29.345 |
| 2009/0140343 | A1 | 6/2009 | Feilchenfeld et al. |
| 2009/0166736 | A1 | 7/2009 | Park |
| 2009/0256212 | A1 | 10/2009 | Denison et al. |
| 2009/0273029 | A1 | 11/2009 | Tien et al. |
| 2009/0283825 | A1 | 11/2009 | Wang et al. |
| 2010/0140701 | A1 | 6/2010 | Kim |
| 2011/0024836 | A1 | 2/2011 | Zinn |
| 2013/0277742 | A1 | 10/2013 | Lee et al. |
| 2014/0042527 | A1 | 2/2014 | Lee et al. |
| 2014/0339632 | A1* | 11/2014 | Yu ................ H01L 29/66681 |
| | | | 438/286 |
| 2015/0014768 | A1* | 1/2015 | Chen ................ H01L 29/66704 |
| | | | 438/286 |
| 2015/0137229 | A1 | 5/2015 | Sulistyanto et al. |
| 2015/0243777 | A1 | 8/2015 | Fujii |
| 2017/0025532 | A1 | 1/2017 | Mori et al. |
| 2019/0097044 | A1* | 3/2019 | Lee ................ H01L 29/42376 |

FOREIGN PATENT DOCUMENTS

| | | |
|---|---|---|
| JP | 2015023208 A | 2/2015 |
| JP | 2015162581 A | 9/2015 |
| JP | 2017028116 A | 2/2017 |
| WO | 2014/061254 A1 | 4/2014 |

* cited by examiner

○ ELECTRICAL FIELD CONCENTRATION POINT

FIG.3

○ ELECTRICAL FIELD
CONCENTRATION POINT

RELATED ART

SEMICONDUCTOR DEVICE

CROSS-REFERENCE TO RELATED APPLICATION

This application is a divisional application of application Ser. No. 16/355,620 filed on Mar. 15, 2019, which claims priority under 35 USC 119 from Japanese Patent Application No. 2018-064309, filed on Mar. 29, 2018, the disclosure of which is incorporated by reference herein.

BACKGROUND

Technical Field

The present disclosure relates to a semiconductor device, for example a semiconductor device including a high withstand voltage element with a Laterally Diffused Metal Oxide Semiconductor (LDMOS) transistor structure.

Related Art

LDMOS transistor structures are structures in which impurities are laterally diffused in the vicinity of the drain, and are structures employed to weaken electrical field strength between the drain and the gate. Various research into LDMOS transistors is ongoing from such perspectives as the transistor withstand voltage, ON/OFF resistance, Electrostatic Discharge (ESD) withstand voltage, and the like.

An example of conventional semiconductor devices including LDMOS transistors is disclosed in Japanese Patent Application Laid-Open (JP-A) No. 2011-187853. This semiconductor device includes an N-type drift diffusion region formed in an upper portion of a semiconductor substrate, a P-type body diffusion region formed in an upper portion of the semiconductor substrate, an N-type source diffusion region formed in an upper portion of the body diffusion region, an insulating film filled in a trench formed in an upper portion of the drift diffusion region and formed at a position separated from the body diffusion region, an N-type drain diffusion region formed in an upper portion of the drift diffusion region and adjacent to the insulating film in the opposite direction to the source diffusion region as viewed from the insulating film, and a gate electrode formed from a position above the body diffusion region and passing over the drift diffusion region to above the insulating film with a gate insulating film is interposed therebetween. The drift diffusion region includes a substrate interior region, and a surface region that is formed above the substrate interior region and below the gate electrode, and includes an N-type impurity at a higher concentration than in the substrate interior region. Withstand voltage performance can be maintained while also enabling low ON resistance to be achieved in an LDMOS transistor by adopting the configuration described in JP-A No. 2011-187853.

Moreover, International Publication (WO) No. 2014/061254 discloses a field-effect transistor including an N-type drift region disposed between a region configuring a channel of a semiconductor substrate and an N-type drain, a field oxide film disposed above the drift region, and a P-type first impurity diffusion layer disposed in the semiconductor substrate below the drift region. The drift region includes an N-type first drift layer, and a second drift layer disposed above the first drift layer and having a higher N-type impurity concentration than the first drift layer. Due to a field-effect transistor adopting the above configuration of WO No. 2014/061254, the drain withstand voltage in an OFF state can be raised while also enabling a drain withstand voltage in an ON state to be raised.

JP-A No. 2008-182106 discloses a semiconductor device including a substrate containing a semiconductor layer, an N-type drain drift region formed in a surface layer portion of the semiconductor layer, a trench formed within the drain drift region, a trench insulating film formed on inner wall faces of the trench, a doped Poly-Si disposed within the trench with the trench insulating film interposed therebetween, a P-type channel region formed in the surface layer portion of the semiconductor layer so as to touch the drain drift region, an N-type source region formed in a surface layer portion of the channel region, an N-type drain region formed in the surface layer portion of the semiconductor layer on the opposite side of the drain drift region to the source region, a gate insulating film formed on the surface of the channel region, a gate electrode formed on the surface of the gate insulating film and coupled to the doped Poly-Si, a source electrode connected to the source region, and a drain electrode connected to the drain region. JP-A No. 2008-182106 is capable of securing the ESD resistance in a semiconductor device provided with an LDMOS transistor.

Figure 9:
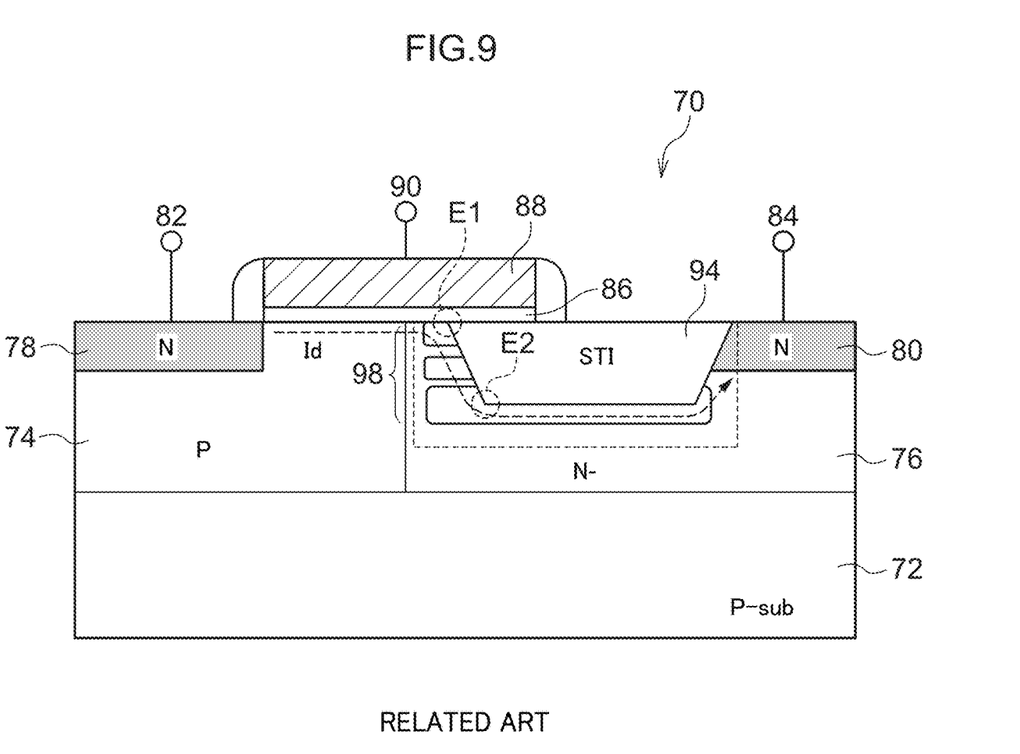
FIG. 9 is a cross-section illustrating configuration of a semiconductor device according to a comparative example.

Detailed explanation follows regarding the structure of an LDMOS transistor, with reference to FIG. 9. A semiconductor device 70 of a comparative example illustrated in FIG. 9 is an example of an LDMOS transistor. The semiconductor device 70 has a configuration in which the following are formed on a substrate 72: a P layer 74, an N-layer 76, a source region 78, a drain region 80, a gate oxide film 86, a gate electrode 88, a Shallow Trench Isolation (STI) portion 94, and a drift layer 98.

As illustrated in FIG. 9, in the semiconductor device 70, a path that a drain current Id flows along is lengthened by the STI portion 94. The semiconductor device 70 includes the drift layer including three layers in order to improve trade-off in characteristics of the drain withstand voltage against the ON resistance of the semiconductor device 70 (generally ON resistance falls when attempting to increase the drain withstand voltage).

However, the following arises in the semiconductor device 70 according to the comparative example. In the semiconductor device 70, the drain current Id flows between the source and the drain when a bias voltage (for example approximately 18V) is applied to a drain terminal 84, and a bias voltage (for example approximately 1.8V) is applied to a gate terminal 90. Micro leakage current is generated by the electrical field generated on the path of the drain current Id, and there is an increase in defects and impact ionization rate as a result of this micro leakage current.

Namely, the micro leakage current arising due to an electrical field acting perpendicularly to the gate oxide film 86 flows through the gate oxide film 86, and this can sometimes cause defects as a result. The number of defects increases over time, and, moreover, a leak path is formed by these defects joining up, with this possibly enabling current to flow freely between the gate electrode 88 and the substrate 72 and resulting in breakdown. Although this might be improved by increasing the film thickness of the gate oxide film 86, this would be a trade-off against the value of current flowing in the gate electrode 88.

Further, in the semiconductor device 70, the electrical field tends to be concentrated at the end portions of the STI portion 94. Namely, in the semiconductor device 70, there is a high possibility of electrical field concentration points E1, E2 being generated at the end portions of the STI portion 94. If electrical field concentration points E1 or E2 are generated then the impact ionization rate at these portions increases, potentially generating a lower withstand voltage.

The semiconductor devices according to JP-A No. 2011-187853, WO No. 2014/061254 and JP-A No. 2008-182106 do not address the electrical fields acting perpendicularly to the gate oxide film, as described above.

SUMMARY

The present disclosure provides a semiconductor device including a high withstand voltage semiconductor element structure that may weaken localized electrical field concentration, that may suppress generation of defects due to micro leakage current, and that may raise the withstand voltage.

A first aspect of the present disclosure is a semiconductor device including: a semiconductor substrate; a source region having a first conductivity type formed at one main face of the semiconductor substrate; a drain region having the first conductivity type formed at the one main face and connected to the source region through a channel region; a gate electrode formed above the channel region with an insulating film therebetween; a drift layer having the first conductivity type formed at the one main face at a position between a lower portion of the gate electrode and the drain region; a trench including an opening in which one end is at the lower portion of the gate electrode and another end is at a position adjacent to the drain region, the trench being formed in the semiconductor substrate at a predetermined depth from the one main face to cut vertically across the drift layer; and an electrical field weakening portion provided at vicinity of the one end, the electrical field weakening section weaken an electrical field generated between the source region and the drain region.

According to the above aspect, the present disclosure provides a semiconductor device including a high withstand voltage semiconductor element structure that may weaken localized electrical field concentration, that may suppress generation of defects due to micro leakage current, and that may raise the withstand voltage.

BRIEF DESCRIPTION OF THE DRAWINGS

Exemplary embodiments will be described in detail based on the following figures, wherein.

DETAILED DESCRIPTION

Detailed explanation follows regarding exemplary embodiments for implementing the present disclosure, with reference to the drawings.

First Exemplary Embodiment

Figure 1:
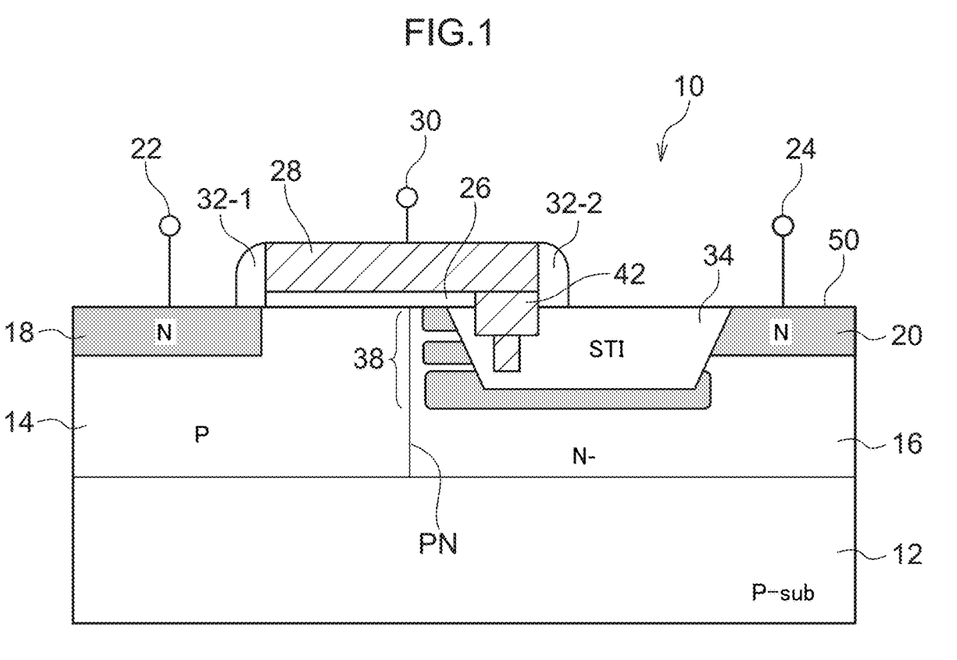
FIG. 1 is a cross-section illustrating a configuration of a semiconductor device according to a first exemplary embodiment.
Figure 2:
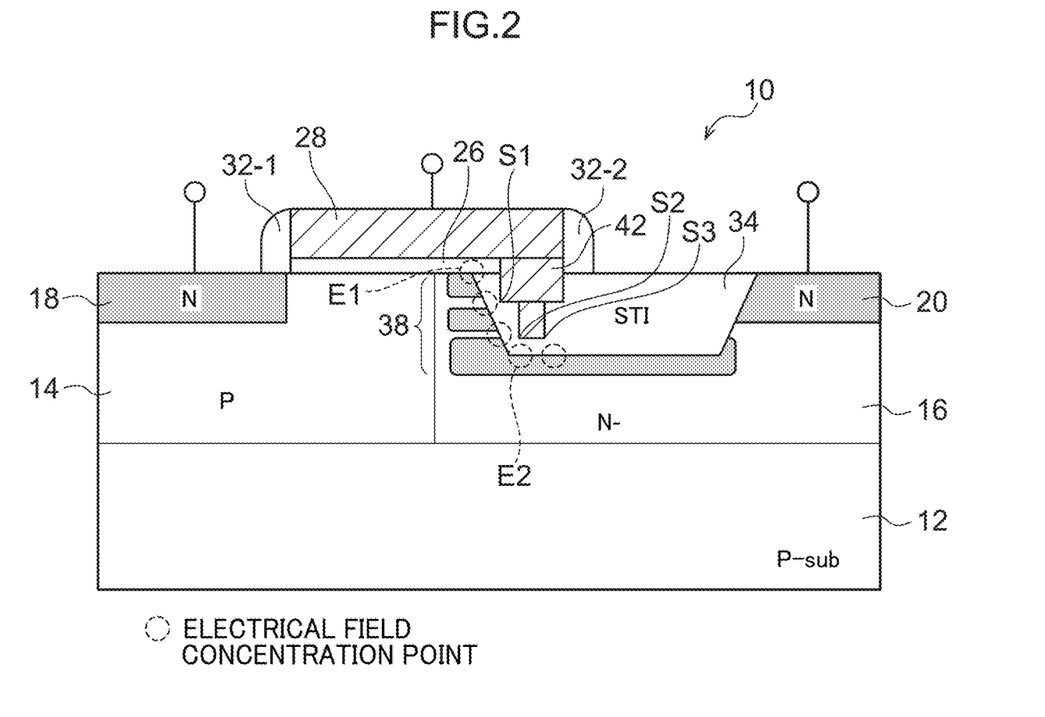
FIG. 2 is a cross-section to explain operation of a semiconductor device according to the first exemplary embodiment.

Explanation follows regarding a semiconductor device 10 according to the present exemplary embodiment, with reference to FIG. 1 and FIG. 2. As illustrated in FIG. 1, the semiconductor device 10 is configured including a semiconductor substrate 12, and formed within one main face 50 of the semiconductor substrate 12, a P diffusion layer 14 (a region diffused with P-type impurities), an N diffusion layer 16 (a region diffused with N-type impurities at a comparatively low concentration), a source region 18 diffused with N-type impurities, a drain region 20 diffused with N-type impurities, a drift layer 38, and an STI portion 34. A PN junction PN is formed by an interface between the P diffusion layer 14 and the N diffusion layer 16.

The semiconductor device 10 further includes a gate oxide film 26 formed on the main face 50, a gate electrode 28 formed on the gate oxide film 26, and sidewalls 32-1, 32-2 formed at the two sides of the gate oxide film 26 and the gate electrode 28. Namely, the semiconductor device 10 configures what is referred to as an LDMOS transistor. A source terminal 22, a gate terminal 30, and a drain terminal 24 are connected to the source region 18, the gate electrode 28, and the drain region 20, respectively.

In MOS transistors there are sometimes cases in which the length of a diffusion region below a gate is lengthened in order to improve the drain withstand voltage. However, this results in an increase in the ON resistance. LDMOS transistors include an STI portion below the gate to improve the above. The STI portion 34 is disposed in LDMOS transistors in a diffusion region below the gate to improve the trade-off of withstand voltage characteristics against ON resistance characteristics. The presence of the STI portion 34 within the diffusion region reduces the peak in the potential and electrical field below the gate terminal such that the withstand voltage is maintained by a short diffusion region.

In the semiconductor device 10, the drift layer 38 is formed by implanting impurities in three levels at different depths, and an impurity concentration gradient is established in order to optimize the trade-off of increase in driving power against electrical field weakening. Namely, a configuration is adopted for the semiconductor device 10 in which a deep insulating layer is formed by the STI portion 34 in order to raise the drain withstand voltage (breakdown voltage), and the path through which the drain current Id flows is lengthened without increasing the horizontal direction distance thereof.

The STI portion 34 is configured by filling a trench with an insulator (for example an oxide film) in a direction from the main face 50 to the semiconductor substrate 12. As described above, the STI portion 34 has a function of lengthening a path through which current flows without increasing the horizontal direction distance thereof. The drift layer 38 is a three-layered diffusion layer formed by implanting N-type impurities three times, and has a function of improving the trade-off of characteristics of the drain withstand voltage against ON resistance (the ON resistance generally falls when attempting to increase the drain withstand voltage). In the present exemplary embodiment, impurities are implanted three times when forming the drift layer 38 in order to establish a concentration gradient in the drift layer 38. The shape of the concentration gradient is not particularly limited, and it is sufficient to set an optimal concentration gradient in consideration of such factors as the length of the drain current path. However, in the present exemplary embodiment, at least the impurity implantation layer on the side closest to the substrate 12 has a low concentration. Moreover, the number of diffusion layers configuring the drift layer 38 is not limited to three as long as at least one layer is provided. Alternatively, the drift layer 38 may be omitted in consideration of factors such as the strength of the electrical field to be weakened.

As illustrated in FIG. 1, the semiconductor device 10 further includes an enlarged gate electrode 42 configured by a T-shaped electrode formed so as to be connected to the gate electrode 28, passing through the gate oxide film 26, and extending into the interior of the STI portion 34. Although the material used to form the enlarged gate electrode 42 is not particularly limited, in the present exemplary embodiment polysilicon (polycrystalline silicon) is employed therefor.

Explanation follows regarding effects of the enlarged gate electrode 42, with reference to FIG. 2.

As illustrated in FIG. 9, in a semiconductor device 70 according to a comparative example, electrical field concentration points arise at the two locations E1, E2 at the end portions (edges) of the STI portion 94. A concentration of electrical field generally tends to occur when there are end portions having a uniform angle present (referred to hereafter as "corners") within an electrical field, and the electrical field is more likely to concentrate the smaller the angle of the corner (the more acute the angle is). Namely, in the semiconductor device 70, the electrical field is more concentrated at the electrical field concentration point E1 than at the electrical field concentration point E2. For a uniform electrical field in a direction from the source region 78 toward the drain region 80, the peak of the electrical field at each corner is different depending on the number of corners present within the electrical field. In other words, the concentration of the electrical field may be weakened when there are many corners present within the electrical field.

In consideration of the above phenomenon, the enlarged gate electrode 42 is provided to increase the number of corners present within the electrical field and to reduce the peak value of the electrical fields at each corner. As illustrated in FIG. 2, the enlarged gate electrode 42 includes corners S1, S2, S3. Points where the electrical field concentrates are accordingly generated on a side face of the STI portion 34, with these points corresponding to the corners S1, S2, S3. In the semiconductor device 10, as illustrated in FIG. 2, there are accordingly three further points generated where the electrical field is concentrated, in addition to the two electrical field concentration points E1, E2 of the semiconductor device 70. This forms five electrical field concentration points in total. Due to the resulting increase in the number of electrical field concentration points, the peak of the potentials for each of the electrical field concentration points may be lowered, and the withstand voltage may be raised.

In other words, in the semiconductor device 10, locations where concentrations are generated in the electrical field are dispersed due to burying the T-shaped enlarged gate electrode 42 in the STI portion 34, thereby weakening the electrical field. This electrical field weakening can be thought of as electrical field weakening employing what is referred to as a field plate effect. Trapping of micro leakage currents and an increase in the impact ionization rate may be prevented by this electrical field weakening. Note that the positions of the corners S1, S2, S3 of the enlarged gate electrode 42 are preferably determined such that a concentration in electrical field is generated at positions not coinciding with the electrical field concentration points E1, E2.

Second Exemplary Embodiment

Figure 3:
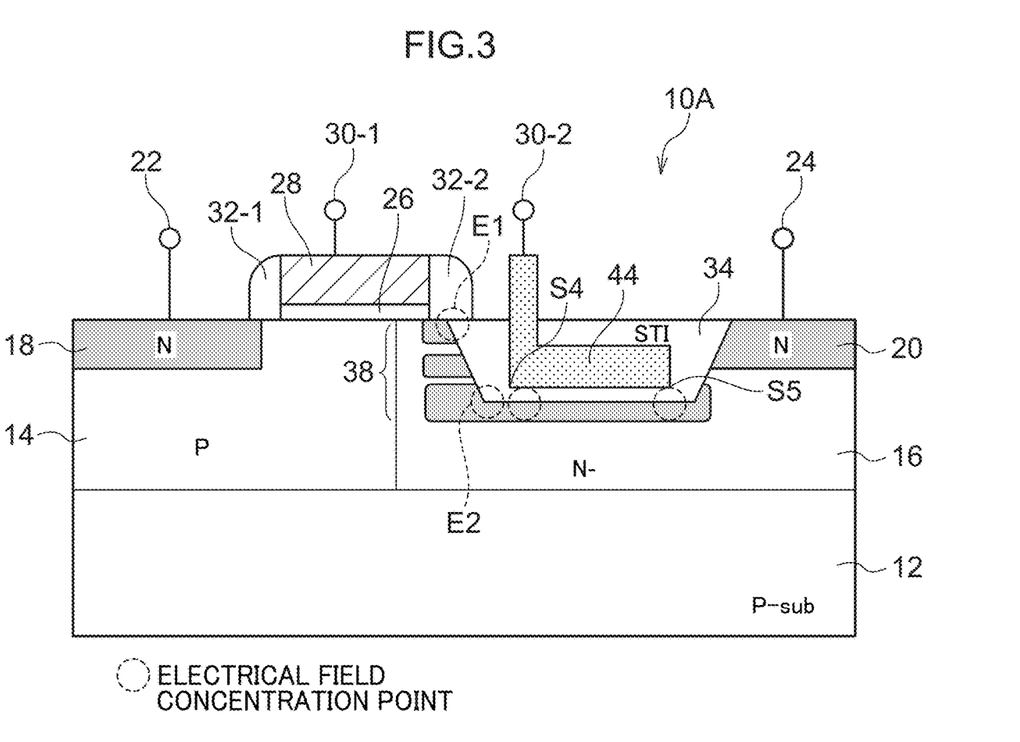
FIG. 3 is a cross-section illustrating a configuration of a semiconductor device according to a second exemplary embodiment.

Explanation follows regarding a semiconductor device 10A according to the present exemplary embodiment, with reference to FIG. 3. The semiconductor device 10A is an embodiment in which a portion of configuration corresponding to the enlarged gate electrode 42 of the semiconductor device 10 according to the exemplary embodiment described above has been modified. Accordingly, configurations similar to those of the semiconductor device 10 are allocated the same reference numerals, and detailed explanation thereof is omitted.

As illustrated in FIG. 3, the semiconductor device 10A includes a second gate electrode 44 buried in the STI portion 34. The second gate electrode 44 according to the present exemplary embodiment is, for example, formed from polysilicon, and is connected to a gate terminal 30-2. Namely, the semiconductor device 10A includes two gate terminals: a gate terminal 30-1 connected to the gate electrode 28, and the gate terminal 30-2 mentioned above.

Explanation follows regarding effects of the second gate electrode 44.

Corners S4, S5 are present at the second gate electrode 44. This enables electrical field concentration to be dispersed by a field plate effect similarly to in the semiconductor device 10, enabling the impact ionization rate to be reduced. Namely, two points are generated where the electrical field is concentrated on a peripheral face of the STI portion 34, with these points corresponding to the corners S4, S5. There are accordingly a total of four points generated where the electrical field is concentrated when these points are added to the electrical field concentration points E1, E2 of the semiconductor device 70. As a result the peak value of the potentials at the electrical field concentration points may be suppressed and the withstand voltage may be raised. Note that, as described above, the positions of the corners S4, S5 of the second gate electrode 44 are preferably set as positions offset from the corners of the STI portion 34 (the corners where the electrical field concentration points E1, E2 are generated). Note that when the semiconductor device 10A is deployed in an actual circuit, it is employed with the gate terminals 30-1 and 30-2 connected outside the semiconductor device 10A. By this configuration, the gate current increases due to the increase in the surface area of the gate electrodes, and may also increase the drain current Id.

Note that explanation has been given in the exemplary embodiment described above regarding an embodiment in which the T-shaped enlarged gate electrode 42 is formed of polysilicon, and explanation is given in the present exemplary embodiment regarding an embodiment in which the L-shaped second gate electrode 44 is formed from polysilicon. However, the shape of the polysilicon buried in the STI portion 34 is not limited thereto, and an appropriate shape may be selected therefor in consideration of such factors as the locations where the electrical field concentration locations are generated, the number thereof that are generated, and the like.

Third Exemplary Embodiment

Figure 4:
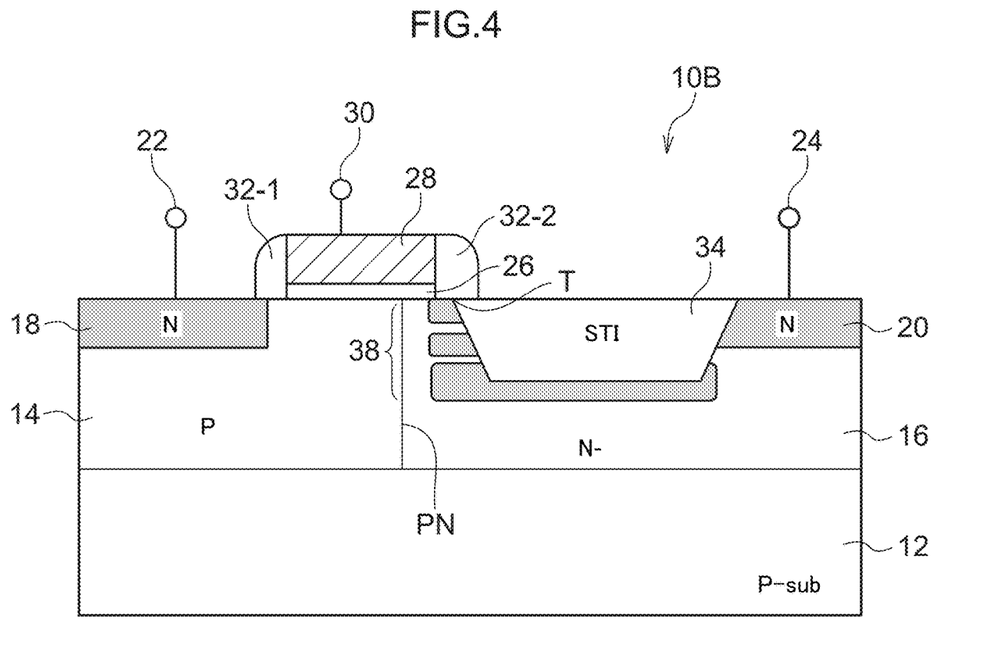
FIG. 4 is a cross-section illustrating a configuration of a semiconductor device according to a third exemplary embodiment.

Explanation follows regarding a semiconductor device 10B according to the present exemplary embodiment, with reference to FIG. 4. The semiconductor device 10B is an embodiment in which a portion of configuration corresponding to the enlarged gate electrode 42 of the semiconductor device 10 according to the exemplary embodiment described above has been modified. Accordingly, configurations similar to those of the semiconductor device 10 are allocated the same reference numerals, and detailed explanation thereof is omitted.

As illustrated in FIG. 4, in the semiconductor device 10B according to the present exemplary embodiment, one end portion T of the STI portion 34 is positioned below a sidewall 32-2. Namely, the positions of the STI portion 34 and the drift layer 38 are shifted toward the drain region 20 side (the right side when viewing the drawing face-on) with respect to in the semiconductor device 70 (see FIG. 9). As described above, an electrical field tends to concentrate at the end portion T of the STI portion 34. However, electrical field concentration is weakened by moving the end portion T of the STI portion 34 where an acute angle is formed away from the position the gate oxide film 26 and covering the end portion T from above with an insulator. The present exemplary embodiment focuses on this phenomenon.

Namely, in the semiconductor device 10B, the end portion T of the STI portion 34 is covered by the sidewall 32-2, and the position of the end portion T is positioned away from being at a position below the gate oxide film 26. The sidewalls 32-1, 32-2 according to the present exemplary embodiment are, as an example, formed by a nitride film. As a result, the generation of defects by micro leakage current may be suppressed in the semiconductor device 10B. However, were the gate oxide film 26 to be moved far away from the PN junction PN then this would generated a concentration in electrical field and an increase in the impact ionization rate. Accordingly, the position of the PN-junction PN needs to be at least a position below the gate oxide film 26.

Fourth Exemplary Embodiment

Figure 5:
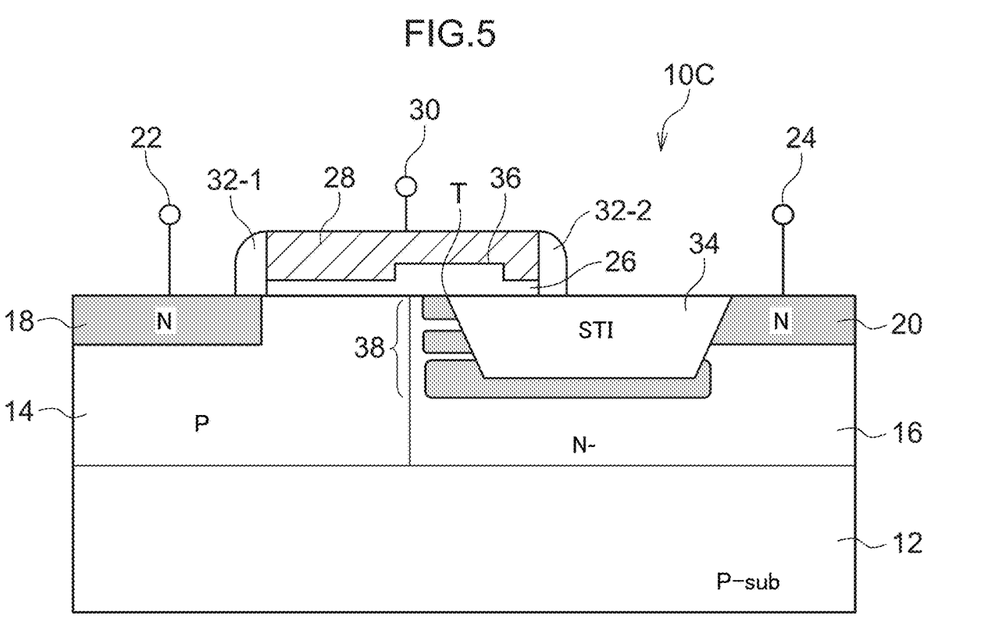
FIG. 5 is a cross-section illustrating a configuration of a semiconductor device according to a fourth exemplary embodiment.
Figure 6:
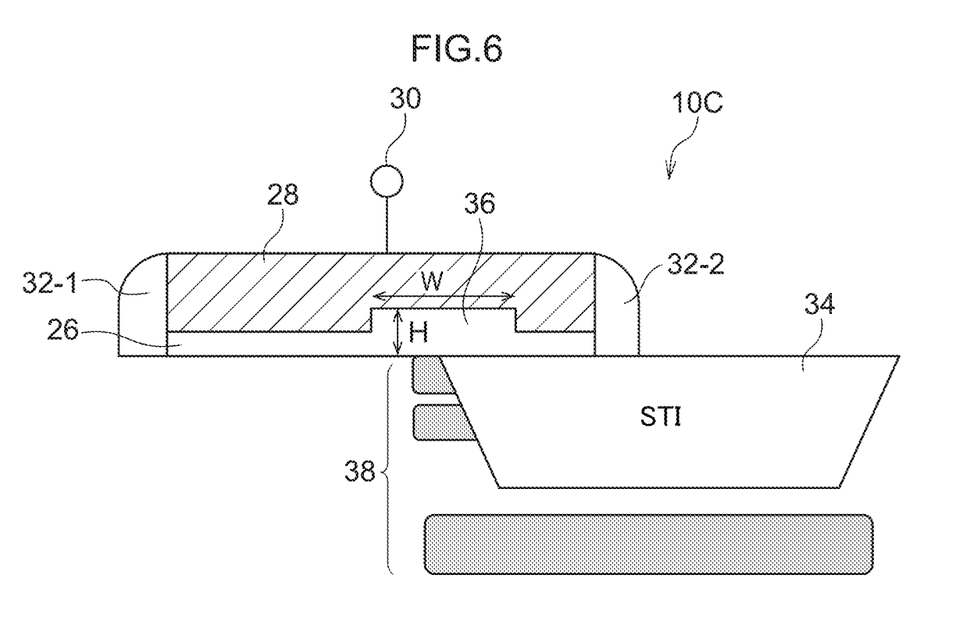
FIG. 6 is a cross-section to explain details of a configuration of a semiconductor device according to the fourth exemplary embodiment.
Figure 7A:
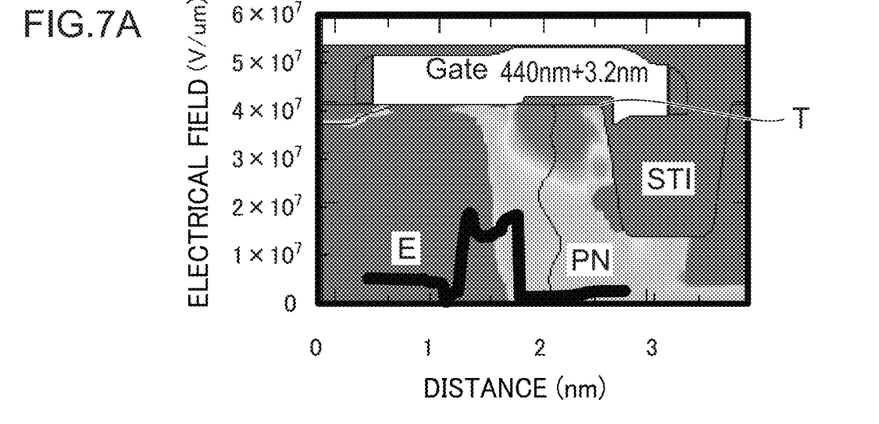
FIG. 7A is a diagram illustrating electrical field distribution in a semiconductor device according to the fourth exemplary embodiment.
Figure 7B:
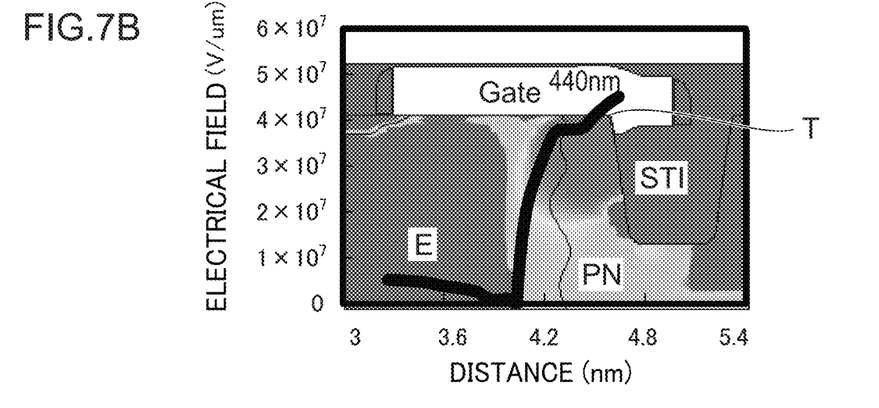
FIG. 7B is a diagram illustrating electrical field distribution in a semiconductor device according to a comparative example.
Figure 7C:
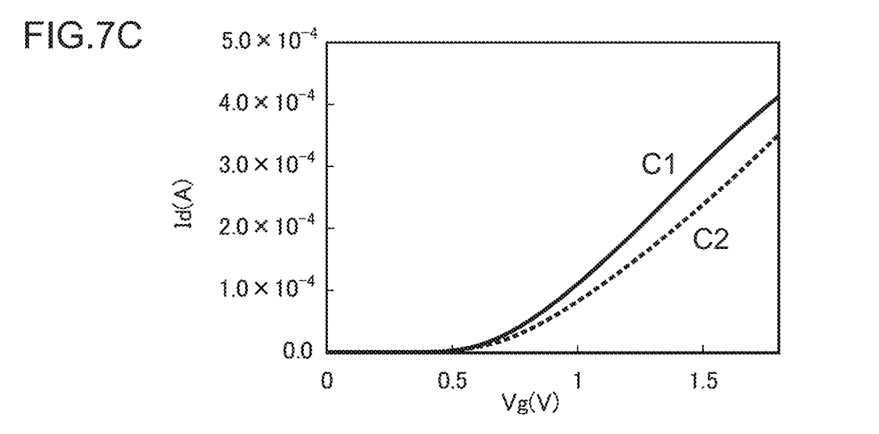
FIG. 7C is a diagram illustrating a comparison between current values of a semiconductor device according to the fourth exemplary embodiment and current values of a semiconductor device according to a comparative example.

Explanation follows regarding a semiconductor device 10C according to the present exemplary embodiment, with reference to FIG. 5 to FIG. 7. The semiconductor device 10C is an embodiment in which the shape of the gate oxide film 26 is modified from that of the semiconductor device 70 (see FIG. 9). Configurations similar to those of the semiconductor device 10 are allocated the same reference numerals, and detailed explanation thereof is omitted.

As illustrated in FIG. 5, in the semiconductor device 10C, the STI portion 34 is disposed below the gate electrode 28, and a thickened film portion 36 having a thicker film thickness is included in the gate oxide film 26 at the position of the one end portion T of the STI portion 34 and positions in the vicinity thereof.

In the semiconductor device 70 according to the comparative example (see FIG. 9), the film thickness is also thick at the upper layer portion of the STI portion 94. However, due to the thickened film portion merely being the upper layer portion of the STI portion 94, in a case in which the withstand voltage falls due to impact ionization, there is a possibility that it would not be possible to weaken the electrical field in the vertical direction to raise the withstand voltage. The present exemplary embodiment improves this point by raising the withstand voltage while maintaining driving power (current value). Namely, the present exemplary embodiment weakens the electrical field in the vertical direction by locally thickening a gate oxide film thickness directly above a position wherein impact ionization is generated in an LDMOS transistor (a transistor provided with a high withstand voltage MOS structure), and improves the trade-off of withstand voltage against driving power by further optimizing the width and thickness of the thickened film. This considers that the fact that positions where impact ionization is generated are a factor directly determining the withstand voltage of a semiconductor device. A rise in the withstand voltage is efficiently achieved by implementing countermeasures at these positions.

As illustrated in FIG. 5, the thickened film portion 36 is provided to the semiconductor device 10C such that the film thickness of the gate oxide film 26 is thickened above the end portion T on the gate electrode 28 side of the STI portion 34, and the electrical field acting perpendicularly to the gate oxide film 26 at the thickened film portion 36 is smaller. Namely, an electrical field perpendicular to the drain current Id flowing between the source and the drain (between the source region 18 and the drain region 20) becomes smaller. This enables micro leakage current in the semiconductor device 10C to be suppressed from being generated and the withstand voltage of the semiconductor device 10C to be raised as a result. Moreover, as described later, the current value of the drain current Id can also be suppressed from falling since the horizontal direction length of the thickened film portion 36 is short. Namely, the withstand voltage can be raised without the current value of the drain current Id falling.

More detailed explanation follows regarding configuration of the semiconductor device 10C, with reference to FIG. 6. FIG. 6 illustrates relevant portions extracted from the semiconductor device 10C illustrated in FIG. 5. As illustrated in FIG. 6, the thickened film portion 36 according to the present exemplary embodiment has a substantially rectangular shape with a lateral direction width W and a vertical direction height H. The withstand voltage is raised by increasing the width W or increasing the height H. However, this would also lead to a lower driving power due to a reduction in the gate current value. Namely, the width W and the height H of the thickened film portion 36 are preferably determined while considering the trade-off of driving power against withstand voltage.

Next, explanation follows regarding effects of the thickened film portion 36 provided to the semiconductor device 10C, with reference to simulation results in FIG. 7A to FIG. 7C. FIG. 7A illustrates simulation results of electrical field distribution in a region including the STI portion 34 and the PN junction PN for the semiconductor device 10C provided with the thickened film portion 36 according to the present exemplary embodiment, together with a graph of electrical field E. FIG. 7B illustrates similar simulation results for the semiconductor device 70 according to a comparative example lacking the thickened film portion 36. The thickness of the gate oxide film 86 in the semiconductor device 70 (FIG. 7B) is approximately 440 nm, and in the semiconductor device 10C (FIG. 5) the thickened film portion 36 having a thickness (difference) of approximately 3.2 nm is formed on the gate oxide film 26 having a thickness of 440 nm. Namely, the height H of the thickened film portion 36 is approximately 443.2 nm. Note that the size of the thickened film portion 36 is merely an example, and there is no limitation thereto.

As is clearly apparent from a comparison of FIG. 7A and FIG. 7B, the electrical field is weakened (the darker colored portions are reduced) due to the thickened film portion 36. Moreover, from a comparison of the curves of the electrical fields E, it is also apparent that a monotonic increase in the electrical field E from the substrate side toward the vicinity of the end portion T in the semiconductor device 70 illustrated in FIG. 7B, the electrical field E tops out significantly before the end portion T, and the peak of the electrical field E is also reduced in the semiconductor device 10C illustrated in FIG. 7A.

FIG. 7C illustrates simulation results when the drain current Id of the semiconductor device 10C (curve C1) and the drain current Id of the semiconductor device 70 (curve C2) are compared. It can be seen that despite the semiconductor device 10C being provided with the thickened film portion 36, a drain current Id that is not inferior to that of the semiconductor device 70 can still be made to flow. The results of the simulations this time indicate that the drain current Id of the semiconductor device 10C is, in fact, larger than the drain current of the semiconductor device 70, and the drivability of the semiconductor device 10C can at least be said not to be lower than the drivability of the semiconductor device 70.

As described above, in the present exemplary embodiment, the electrical field acting perpendicularly to the gate oxide film 26 may be weakened, the generation of micro leakage current in the gate oxide film 26 may be reduced, and insulating film breakdown over time may be suppressed from occurring. Note that "insulating film breakdown over time" refers to the phenomenon described above, in which defects are generated within the gate oxide film 26 by the flow of micro leakage current, leading to breakdown when the defects join up to form a leak path. Moreover, by thickening the film thickness of the gate oxide film 26 directly above the position where impact ionization is generated, this being a direct factor in determining the withstand voltage, an electrical field in the perpendicular direction may be efficiently weakened, and the withstand voltage may be raised easily.

Fifth Exemplary Embodiment

Figure 8A:
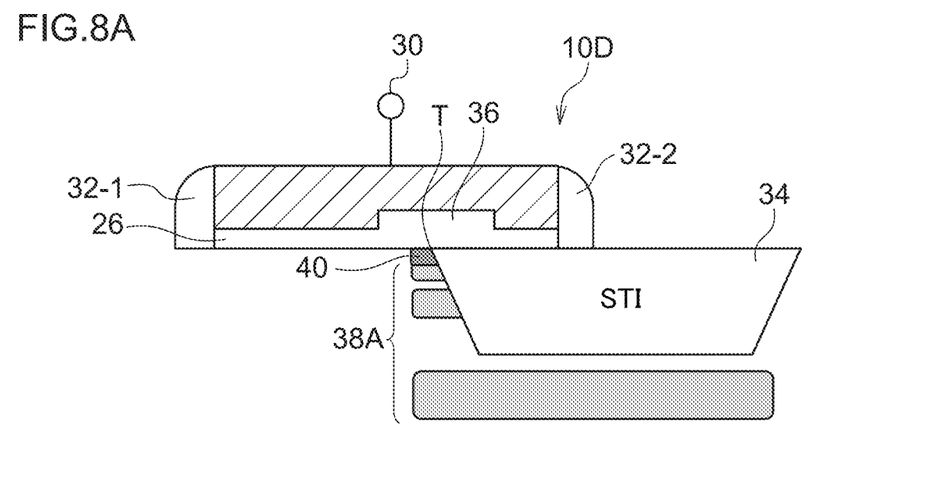
FIG. 8A is a cross-section illustrating a semiconductor device according to a fifth exemplary embodiment.
Figure 8B:
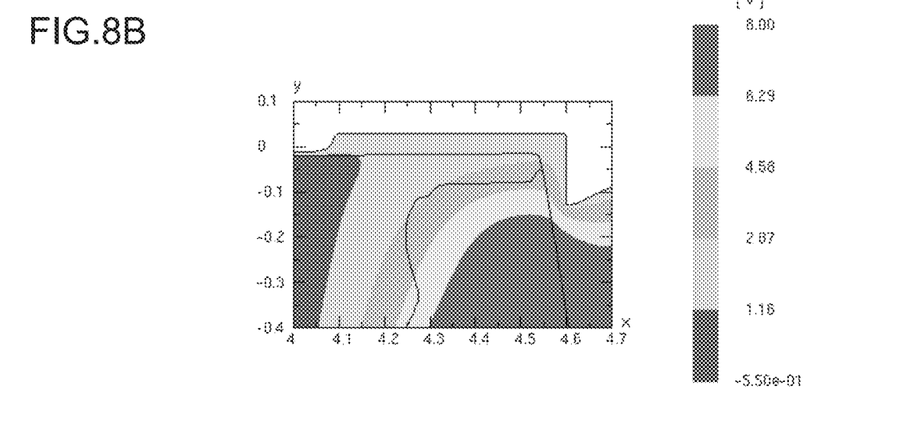
FIG. 8B is a diagram illustrating electrical field distribution of a semiconductor device according to the fifth exemplary embodiment.
Figure 8C:
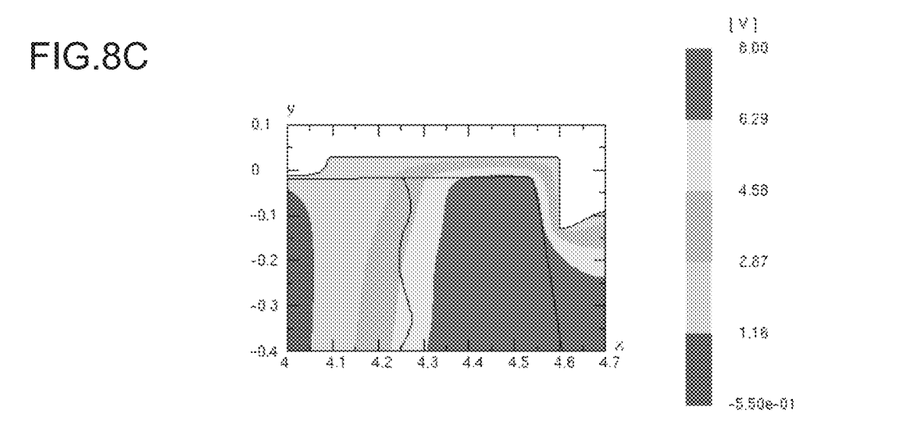
FIG. 8C is a diagram illustrating electrical field distribution in a semiconductor device according to a comparative example.

Explanation follows regarding a semiconductor device 10D according to the present exemplary embodiment, with reference to FIG. 8A to FIG. 8C. The semiconductor device 10D is an embodiment in which the drift layer 38 of the semiconductor device 10C according to the exemplary embodiment described above is modified to a drift layer 38A. Accordingly, configurations similar to those of the semiconductor device 10C are allocated the same reference numerals and detailed explanation thereof is omitted. FIG. 8A illustrates an example of a configuration of the semiconductor device 10D. FIG. 8B illustrates simulation results of electrical field distribution for the semiconductor device 10D according to the present exemplary embodiment. FIG. 8C illustrates, for comparative purposes, simulation results relating to electrical field distribution for the semiconductor device 10C.

In the semiconductor device 10D as illustrated in FIG. 8A, a P-type implantation region 40 is formed in the vicinity of the end portion T of the STI portion 34. The P-type implantation region 40 is a region formed by ion implantation of P-type impurities to part of the N-type drift layer 38. As examples of P-type impurities may include boron. The semiconductor device 10D is an example of an embodiment in which the P-type implantation region 40 is formed to the implantation layer closest to the surface out of the three layers of the drift layer 38. However, the position for forming the P-type implantation region 40 may be determined in consideration of the position of electrical field concentration points, and may be formed in a lower implantation layer. Moreover, the concentration of the P-type impurities implanted in the P-type implantation region 40 is lower than the concentration of N-type impurities implanted in this implantation layer of the drift layer 38. Namely, overall conductivity of N-type is maintained in the P-type implantation region 40.

The P-type implantation region 40 weaken the electrical field acting perpendicularly to the gate oxide film 26. Namely, the P-type implantation region 40 lowers the N-type concentration, and increases the resistance in the vicinity of the end portion T of the STI portion 34 of the drift layer 38 so that current flows less readily. In other words, the electrical field acting perpendicularly to the gate oxide film 26 may be weakened to an even greater extent than in the semiconductor device 10C, due to lowering the potential directly below the gate oxide film 26. Accordingly, the semiconductor device 10D may enable more effective suppression of micro leakage current generation, may enable breakdown of the insulating film over time to be further suppressed from occurring, and may raise the withstand voltage.

As is clearly apparent from a comparison of the simulation results illustrated in FIG. 8B and FIG. 8C, the electrical field distribution of the semiconductor device 10D (FIG. 8B) is weakened to a greater extent than the electrical field distribution of the semiconductor device 10C (FIG. 8C).

Note that although the semiconductor devices (semiconductor devices 10, and 10A to 10D) according to the respective exemplary embodiments described above have been individually described, each of these semiconductor devices shares the object of weakening the electrical field acting perpendicularly to the gate oxide film 26, and an embodiment may be adopted that combines configuration from the respective semiconductor devices. For example, although an example has been described in which the semiconductor device 10D is configured by forming the P-type implantation region 40 to the semiconductor device 10C (FIG. 5) provided with the thickened film portion 36, there is no limitation thereto. The P-type implantation region 40 may be formed to any out of the semiconductor devices 10, 10A, or 10B.

Although explanation has been given in the exemplary embodiments described above regarding examples in which the drift layer 38 includes an implantation layer of three layers, this approach is adopted with the intention of more efficient electrical field weakening. Depending on the extent of electrical field weakening desired, an embodiment including a drift layer with two layers or one layer, or even an embodiment lacking a drift layer, may be adopted.

What is claimed is:

1. A semiconductor device comprising:
   a semiconductor substrate;
   a source region having a first conductivity type formed within one main face of the semiconductor substrate;
   a drain region having the first conductivity type formed within the one main face;
   a gate electrode formed above the one main face with an insulating film therebetween;
   a shallow trench isolation (STI) layer within the one main face and including one end adjacent the gate electrode;
   first and second sidewalls on opposite sides of the gate electrode; and
   an L-shaped electrical field weakening portion located within the STI layer, the L-shaped electrical field weakening portion weakens an electrical field generated between the source region and the drain region,
   wherein the L-shaped electrical field weakening portion includes a corner section, a horizontal section and a vertical section,
   wherein the horizontal section extends horizontally from the corner section, and the vertical section extends vertically upward from the corner section,
   wherein the corner section and the horizontal section of the L-shaped electrical field weakening portion are buried within the STI layer below an upper surface of the STI layer, and the vertical section of the L-shaped electrical field weakening portion protrudes upwardly through the upper surface of the STI layer,
   wherein the first sidewall extends partially over the source region, and
   wherein the second sidewall extends partially over the one end of the STI layer.

2. The semiconductor device of claim 1, wherein lower corners of the L-shaped electrical field weakening portion are vertically and horizontally offset from lower corners of the STI layer.

3. The semiconductor device of claim 1, wherein another end of the STI layer is adjacent to the drain region.

4. The semiconductor device of claim 3, wherein the horizontal section of the L-shaped electrical field weakening portion extends from the corner section of the L-shaped electrical field weakening portion towards the drain region.

5. The semiconductor device of claim 1, further comprising a drift layer having the first conductivity type formed within the one main face between a lower portion of the gate electrode and the drain region.

6. The semiconductor device of claim 5, further comprising:
   a first region having a second conductivity type formed within the one main face, wherein the source region is formed within the first region; and
   a second region having the first conductivity type formed within the one main face, wherein the drain region and the drift layer are formed within the second region, and wherein an impurity concentration of the second region is lower than an impurity concentration than the drift layer,
   wherein an interface between the first region and the second region is aligned below the insulating film.

7. The semiconductor device of claim 5, wherein the drift layer includes a plurality of diffusion layers that have the first conductivity type and are formed at different depths within the one main face.

8. The semiconductor device of claim 1, wherein the electrical field weakening portion is formed from polysilicon.

9. The semiconductor device of claim 1, wherein the gate electrode is connected to a first gate terminal,
   wherein the L-shaped electrical field weakening portion is an electrode and is connected to a second gate terminal.

* * * * *